United States Patent

Snelten et al.

[11] Patent Number: 5,742,165
[45] Date of Patent: Apr. 21, 1998

[54] MAGNETIC RESONANCE APPARATUS

[75] Inventors: Jeroen Snelten; Peter H. Wardenier, both of Eindhoven, Netherlands

[73] Assignee: U.S. Philips Corporation, New York, N.Y.

[21] Appl. No.: 749,936

[22] Filed: Nov. 14, 1996

[30] Foreign Application Priority Data

Nov. 14, 1995 [EP] European Pat. Off. ............ 95203102

[51] Int. Cl.$^6$ .................................................. G01V 3/00
[52] U.S. Cl. .................................... 324/318; 324/322
[58] Field of Search ............................. 324/322, 318, 324/316, 309, 307, 314, 300; 128/653.5

[56] References Cited

U.S. PATENT DOCUMENTS

| | | | |
|---|---|---|---|
| 4,691,164 | 9/1987 | Haragashira | 324/322 |
| 4,725,780 | 2/1988 | Yoda et al. | 324/318 |
| 5,349,298 | 9/1994 | Nakabayashi | 324/322 |
| 5,477,147 | 12/1995 | Friedrich et al. | 324/322 |

FOREIGN PATENT DOCUMENTS 62-207942A 12/1987 Japan.

*Primary Examiner*—Louis M. Arana
*Attorney, Agent, or Firm*—Jack D. Slobod

[57] ABSTRACT

Magnetic resonance includes predetermined frequency and which is connected, via a connection circuit (14), to a transmission and/or receiving device (11, 13) for RF signals, said connection circuit comprising a coaxial cable (41) having a central conductor (45) and a conductor sheath (47) which coaxially encloses the central conductor. Over at least a part of its length the coaxial cable (41) is enclosed, by a tubular conductor (49) having first and second ends (51, 53), a dielectric (50) being present between the conductor sheath (47) and the tubular conductor. The tubular conductor (49) has an electrical length equal to one quarter of the wavelength in the dielectric (50) of electromagnetic radiation of the predetermined frequency. The first end (51) of the tubular conductor (49) is directly electrically connected to the conductor sheath (47) and the second end (53) is connected to the conductor sheath via a capacitor (57). As a result, the physical length (1) of the tubular conductor (49) can be substantially shorter than its electrical length.

3 Claims, 1 Drawing Sheet

5,742,165

MAGNETIC RESONANCE APPARATUS

BACKGROUND OF INVENTION

1. Field of Invention

The invention relates to a magnetic resonance apparatus, including a magnet system for generating a steady magnetic field, a coil system for generating gradient fields, and at least one RF coil which is tuned to a predetermined frequency and is connected, via a connection circuit, to a transmission and/or receiving device for RF signals, which connection circuit includes a coaxial cable having a central conductor and a conductor sheath which coaxially encloses the central conductor, said coaxial cable being enclosed over at least a part of its length by a tubular conductor having first and second ends, a dielectric being present between the conductor sheath and the tubular conductor and said tubular conductor having an electrical length equal to one quarter of the wavelength in the dielectric of electromagnetic radiation having the predetermined frequency, the first end of the tubular conductor being directly electrically connected to the conductor sheath.

2. Description of the Related Art

An apparatus of this kind is known, for example from the abstract in English of JP-A-62-207 912. The tubular conductor aims to suppress currents flowing along the external surface of the conductor sheath of the coaxial cable (sheath currents). If the electrical length of the tubular conductor equals ¼λ, where λ represents said wavelength, the tubular conductor constitutes, in conjunction with the conductor sheath, a short-circuited ¼λ transmission line representing a high impedance. The physical length of the tubular conductor equals ¼λ multiplied by a reduction factor k. The reduction factor k equals $1/\sqrt{\epsilon_r}$, in which $\epsilon_r$ is the relative dielectric constant of the dielectric. The physical length of the tubular conductor determines the minimum length of the coaxial cable and hence also the minimum distance between the RF transmission and/or receiving device and the RF coil. Sometimes it is desirable to have the possibility of choosing a smaller distance between the RF coil and the RF transmission and/or receiving device.

SUMMARY OF INVENTION

It is an object of the invention to provide a magnetic resonance apparatus of the kind set forth in which the physical length of the tubular conductor can be substantially reduced without its electrical length becoming smaller than ¼λ. To achieve this, the apparatus in accordance with the invention is characterized in that the second end of the tubular conductor is connected to the conductor sheath of the coaxial cable via a capacitor. It has been found that the physical length of the tubular conductor can be reduced in dependence on the value of the capacitor.

An embodiment of the apparatus in accordance with the invention is characterized in that, viewed in the longitudinal direction of the coaxial cable, there is provided a succession of at least two tubular conductors, each of which has a first end which is directly electrically connected to the conductor sheath and a second end which is connected to the conductor sheath via a capacitor. The successive arrangement of two or more tubular conductors improves the suppression of the sheath currents. Thanks to the shorter physical length of each tubular conductor, more of these conductors can be provided without the length of the coaxial cable thus being inadmissibly increased.

A further embodiment is characterized in that the electrical length of at least two of the tubular conductors differs. As a result of this step, the tubular conductors suppress sheath currents of different frequency, so that the sheath currents can be suppressed over a wide frequency band or for different, preselected frequencies.

These and other aspects of the invention will be apparent from and elucidated with reference to the embodiments described hereinafter.

DESCRIPTION OF THE PREFERRED EMBODIMENTS

Figure 1:
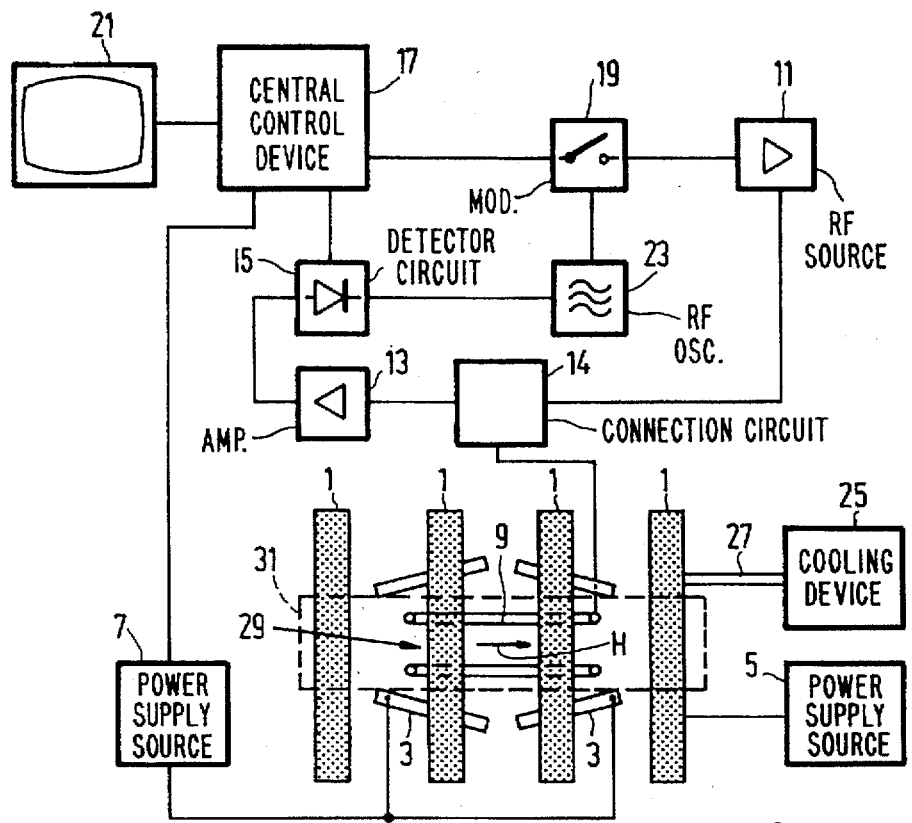
FIG. 1 shows diagrammatically an embodiment of a magnetic resonance apparatus in accordance with the invention.

The magnetic resonance apparatus which is diagrammatically shown in FIG. 1 includes a first magnet system 1 for generating a steady magnetic field H, a second magnet system 3 for generating magnetic gradient fields, and first and second power supply sources 5 and 7 for the first magnet system 1 and the second magnet system 3, respectively. An RF coil 9 serves to generate an RF magnetic alternating field; to this end it is connected to an RF source 11. For detection of spin resonance signals generated in an object to be examined (not shown) by the RF transmitted field, use can also be made of the RF coil 9; to this end this coil is connected to a signal amplifier 13. The connection between the RF source 11 or the signal amplifier 13 on the one side and the RF coil 9 on the other side is established via a connection circuit 14 which will be described in detail hereinafter. The output of the signal amplifier 13 is connected to a detector circuit 15 which is connected to a central control device 17. The central control device 17 also controls a modulator 19 for the RF source 11, the second power supply source 7, and a monitor 21 for image display. An RF oscillator 23 controls the modulator 19 as well as the detector 15 processing the measurement signals. For cooling, if any, of the magnet coils of the first magnet system 1 there is provided a cooling device 25 comprising cooling ducts 27. The RF coil 9, arranged within the magnet systems 1 and 3, encloses a measurement space 29 which is large enough to enclose a patient to be examined, or a part of a patient to be examined, for example the head and the neck, in an apparatus for medical diagnostic measurements. Thus, in the measurement space 29 there can be generated a steady magnetic field H, gradient fields for selecting object slices, and a spatially uniform RF alternating field. The RF coil 9 can combine the functions of transmitter coil and measuring coil and is in that case connected alternately to the RF source 11 and the signal amplifier 13 by the central control device 17. Alternatively, different coils can be used for the two functions, for example surface coils then acting as measuring coils. In that case a connection circuit 14 is provided for the RF transmitter coil as well as for the RF measuring coil. Hereinafter, the RF coil 9 will generally be referred to only as a measuring coil. For the use of the coil as a transmission coil the same considerations apply in conformity with the theorem of reciprocity. If desired, the coil 9 may be enclosed by a Faraday cage shielding RF fields.

Figure 2:
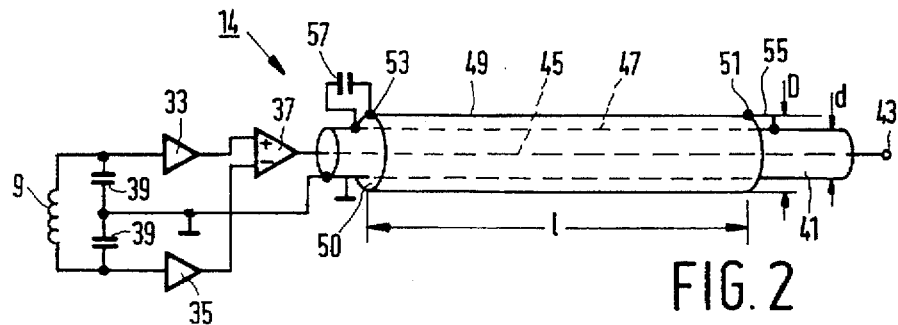
FIG. 2 shows details of an embodiment of the connection circuit of the apparatus shown in FIG. 1.

FIG. 2 shows some details of a first embodiment of the connection circuit 14. The terminals of the RF coil 9 are connected, via respective amplifiers 33 and 35, to the positive and the negative input, respectively, of a differential amplifier 37. Furthermore, the terminals of the RF coil are connected to one another via a series connection of two equal capacitors 39. The capacitance of the capacitors 39 is chosen so that the RF coil is tuned to a preselected frequency $f_0$. The junction of the capacitors 39 is grounded. The symmetrical output signal of the RF coil 9 is thus converted into an asymmetrical signal and, moreover, common mode currents are suppressed to a given extent. The asymmetrical signal is suitable for application, via a coaxial cable 41, to a terminal 43 which may be connected to the signal amplifier 13 directly or via further signal processing circuits (not shown).

As is customary, the coaxial cable 41 includes a central conductor 45 which is enclosed by a conductor sheath 47. Between the central conductor 45 and the conductor sheath 47 there is provided an insulating material which is not specified. The coaxial cable 41 is enclosed by a tubular conductor 49 over a part 1 of its length, said conductor having a first end 51 and a second end 53. Between the conductor sheath 47 and the tubular conductor 49 there is situated a dielectric 50. The dielectric may be, for example air or another electrically insulating material. The diameter of the coaxial cable 41 is denoted by the reference d and the diameter of the tubular conductor 49 by the reference D. The first end 51 of the tubular conductor 49 is directly electrically connected to the conductor sheath 47 of the coaxial cable 41 by means of a connection wire 55. The second end 53 of the tubular conductor 49 is connected to the conductor sheath 47 of the coaxial cable 41 via a capacitor 57. The tubular conductor 49 thus constitutes a short-circuited transmission line having an electrical length of ¼λ, where λ is the wavelength in the dielectric 50 of electromagnetic radiation of the frequency $f_0$ whereto the RF coil 9 is tuned. Such a transmission line constitutes a high impedance for sheath currents having the frequency $f_0$. The relation between the physical length 1 of the tubular conductor 49 and the capacitance C of the capacitor 57 can be calculated as described hereinafter.

The characteristic impedance $Z_0$ of the transmission line is given by:

$$Z_0 = \frac{1}{2\pi} \sqrt{\frac{\mu_0}{\epsilon_0 \cdot \epsilon_r}} \cdot \ln\left[\frac{D}{d}\right] \quad (1)$$

Therein:

$\mu_0 = 4\pi \cdot 10^{-7}$ H/m $\epsilon_0 = 8.85 \cdot 10^{-12}$ F/m $\epsilon_r$ = the dielectric constant of the dielectric 50.

The resonance condition, where the parallel combination of the short-circuit terminated transmission line and the capacitor 57 has a very high (infinite) impedance, is:

$$Z_0 \tan\left[\frac{2\pi l}{\lambda}\right] = \frac{1}{2\pi f_0 C} \quad (2)$$

Therein, λ is the wavelength of electromagnetic radiation in the dielectric 50. It is given by the formula:

$$\lambda = k \cdot \frac{c}{f_0} \quad (3)$$

Therein, k is the cited reduction factor ($k=1/\sqrt{\epsilon_r}$) and c is the velocity of light ($= 3 \cdot 10^8$ m/s).

It follows from (2) that in the absence of the capacitor 57 (C=0):

$$\frac{2\pi l}{\lambda} = \frac{\pi}{2} \Rightarrow l = \frac{\lambda}{4} \quad (4)$$

For each non-zero value of C, 1 can be calculated by means of (2). It will be evident that always:

$$l < \frac{\lambda}{4} \quad (5)$$

This demonstrates that the physical length 1 of the tubular conductor 49 can be substantially smaller than normally required to attain an electrical length of ¼λ when capacitance 57 is added to achieve the resonance condition. As a result, a substantial saving as regards space can be achieved. In the embodiment shown the first end 51 of the tubular conductor 49 is remote from the RF coil 9. If desired, the tubular conductor 49 can also be arranged on the coaxial cable 41 in such a manner that its first end 51 faces the RF coil 9.

Figure 3:
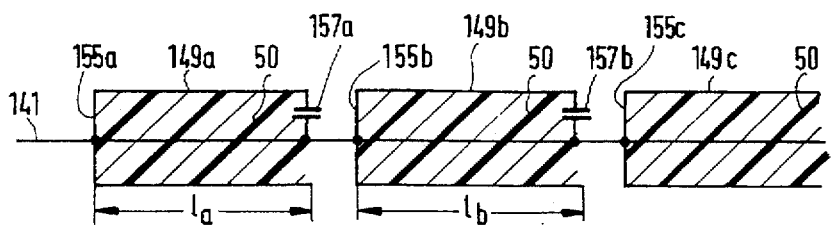
FIG. 3 shows a detail of a further embodiment.

FIG. 3 is a diagrammatic representation of a part of a coaxial cable 141 provided with a series of successive tubular conductors, three of which are denoted by the references 149a, 149b and 149c. The first end of each of these tubular conductors is directly electrically connected to the conductor sheath of the coaxial cable 141 via a connection wire 155a, 155b and 155c, respectively, and the second end thereof is connected thereto via a capacitor, two of which are denoted by the references 157a and 157b in the Figure. The tubular conductors 149a, 149b, . . . have physical lengths $l_a, l_b, \ldots$ which may be equal or different. The capacitances of the capacitors 157a, 157b, . . . may also be equal or different. If the lengths as well as the capacitances are equal, all tubular conductors 149a, 149b, . . . also have the same electrical length. In that case they will cooperate in suppressing sheath currents of the same frequency. If the values of the capacitors 157a, 157b, . . . and/or the lengths $l_a, l_b, \ldots$ differ, the electrical lengths of the tubular conductors 149a, 149b, . . . will also be different and they will suppress sheath currents of different frequencies. These frequencies may be suitably chosen discrete frequencies or also a contiguous frequency band.

We claim:

1. A magnetic resonance apparatus, comprising a magnet system for generating a steady magnetic field, a coil system for generating gradient fields, and at least one RF coil which is connected, via a connection circuit, to a transmission and/or receiving device for RF signals, which connection circuit includes a coaxial cable having a central conductor and a conductor sheath which coaxially encloses the central conductor, and one or more sheath current suppressing elements in succession along the longitudinal direction of the coaxial cable, each sheath current suppressing element comprising a tubular conductor enclosing said coaxial cable over at least a part of its length, which tubular conductor has a first end which is directly electrically connected to the conductor sheath and a second end which is connected to the conductor sheath via a capacitor such that the sheath current suppressing element attains a resonance condition at a respective frequency.

2. A magnetic resonance apparatus as claimed in claim 1, wherein said one or more sheath current suppressing elements comprises at least two sheath current suppressing elements.

3. A magnetic resonance apparatus as claimed in claim 2, wherein at least two of the sheath current suppressing elements are configured to attain a resonance condition at different respective frequencies.

* * * * *